(12) United States Patent
Sugawara et al.

(10) Patent No.: US 6,956,241 B2
(45) Date of Patent: Oct. 18, 2005

(54) SEMICONDUCTOR LIGHT EMITTING ELEMENT WITH IMPROVED LIGHT EXTRACTION EFFICIENCY

(75) Inventors: Hideto Sugawara, Kanagawa (JP);
Yukio Watanabe, Kanagawa (JP);
Hirohisa Abe, Fukuoka (JP); Kuniaki Konno, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/407,867

(22) Filed: Apr. 4, 2003

(65) Prior Publication Data

US 2003/0218172 A1 Nov. 27, 2003

(30) Foreign Application Priority Data

Apr. 5, 2002 (JP) ........................................ 2002-104114

(51) Int. Cl.⁷ ........................ H01L 27/15; H01L 31/12; H01L 33/00
(52) U.S. Cl. ............................ 257/79; 257/94; 257/95; 257/98; 257/103
(58) Field of Search ............................ 257/79, 94, 95, 257/98, 103

(56) References Cited

U.S. PATENT DOCUMENTS

| | | | | |
|---|---|---|---|---|
| 3,537,028 A | * | 10/1970 | Pankove | .................. 372/92 |
| 3,918,150 A | * | 11/1975 | Gantley | .................. 438/464 |
| 5,023,685 A | * | 6/1991 | Bethea et al. | .................. 257/21 |
| 5,040,044 A | * | 8/1991 | Noguchi et al. | .................. 257/103 |
| 5,218,223 A | * | 6/1993 | Spaeth et al. | .................. 257/436 |
| 5,260,588 A | * | 11/1993 | Ohta et al. | .................. 257/93 |
| 5,317,167 A | * | 5/1994 | Izumiya et al. | .................. 257/13 |
| 5,429,954 A | * | 7/1995 | Gerner | .................. 438/33 |
| 5,792,698 A | | 8/1998 | Nishitani | |
| 6,309,953 B1 | * | 10/2001 | Fischer et al. | .................. 438/606 |
| 6,441,403 B1 | * | 8/2002 | Chang et al. | .................. 257/94 |
| 6,515,309 B1 | * | 2/2003 | Tohyama et al. | .................. 257/88 |
| 6,531,405 B1 | * | 3/2003 | Wegleiter et al. | .................. 438/745 |
| 2001/0000209 A1 | * | 4/2001 | Krames et al. | .................. 257/94 |
| 2001/0000410 A1 | * | 4/2001 | Krames et al. | .................. 257/98 |
| 2003/0197191 A1 | * | 10/2003 | Nitta et al. | .................. 257/99 |

FOREIGN PATENT DOCUMENTS

| | | | |
|---|---|---|---|
| DE | 100 06 738 | 9/2001 | |
| JP | 03-024771 | 2/1991 | |
| JP | 03-035568 | 2/1991 | |
| JP | 05-275740 | 10/1993 | |
| JP | 07-038146 | 2/1995 | |
| JP | 07-183575 | 7/1995 | |
| JP | 408130347 | * 5/1996 | ............. H01S/3/18 |
| JP | 08-213649 | 8/1996 | |
| JP | 10-004209 | 1/1998 | |
| JP | 11-121795 | 6/1999 | |
| JP | 11-354837 | 12/1999 | |
| JP | 2000-196141 | 7/2000 | |
| JP | 2000-299494 | 10/2000 | |
| JP | 2001-036129 | 2/2001 | |
| JP | 2001-196630 | 7/2001 | |
| JP | 2001-217467 | 8/2001 | |
| WO | WO0141219 | 6/2001 | |
| WO | WO0161764 | 8/2001 | |

* cited by examiner

*Primary Examiner*—Mary Wilczewski
*Assistant Examiner*—Monica Lewis
(74) *Attorney, Agent, or Firm*—Hogan & Hartson, LLP

(57) ABSTRACT

A high-luminance light emitting element is manufactured by a method comprising: forming a light emitting layer on a first surface of a GaP substrate including the first surface and a second surface opposed to the first surface and having an area smaller than the first area, the light emitting layer emitting light of a wavelength λ permitted to pass through the GaP substrate; forming a plurality of side surfaces on the GaP substrate to be respectively aslant by substantially the same angle to become narrower toward the second surface; and forming a plurality of depressions and protrusions as high as 0.1 λ to 3 λ on the side surfaces.

8 Claims, 8 Drawing Sheets

SEMICONDUCTOR LIGHT EMITTING ELEMENT WITH IMPROVED LIGHT EXTRACTION EFFICIENCY

CROSS-REFERENCE TO RELATED APPLICATIONS

This application is based upon and claims the benefit of priority from the prior Japanese Patent Application No. 2002-104114, filed on Apr. 5, 2002, the entire contents of which are incorporated herein by reference.

BACKGROUND OF THE INVENTION

1. Field of the Invention

The present invention relates generally to a semiconductor light emitting element and a method for manufacturing the same.

2. Related Background Art

Semiconductor light emitting elements, including light emitting diodes (LEDs) for emitting visible light, are widely used as light sources for display purposes because of their excellent features, namely, compactness, low power consumption, high reliability, and so on. Once they are enhanced in luminosity, their application as outdoor displays and light sources for communication will be broadened exponentially. There are AlGaAs, GaAlP and GaP are examples of materials of high-luminance LED already brought into practice, and those for emitting light of red, orange, yellow, green and other colors are actually being supplied at low costs.

Recently, InGaAlP having a band structure of a direct transition type from red to green has been remarked as a high-luminance LED material in this wavelength range. For its crystalline growth, metal organic chemical vapor deposition (MOCVD) and molecular beam epitaxy (MBE) are currently used because, with liquid phase epitaxy (LPE) heretofore used to grow GaAlAs, GaP and other conventional materials, it is difficult to control the composition because of large segregation of Al. In MOCVD and MBE, InGaAlP is formed on a GaAs substrate that is in lattice-matching with InGaAlP.

However, such a GaAs substrate is opaque to light from an InGaAlP active layer. Therefore, there is a development of a method of removing the opaque GaAs substrate and instead bonding a GaP substrate transparent to light from the InGaAlP active layer to obtain a relatively high-luminance LED.

FIG. 16 is a diagram showing a LED using a GaP substrate 200 mentioned above. A light emitting layer 201 made of InGaAlP compound semiconductors and having an InGaAlP active layer is bonded on the GaP substrate. The light emitting layer 201 emits light by current injection from the p-side electrode 202 and the n-side electrode 203. The GaP substrate 200 is transparent to the light from the light emitting layer 201. The transparent substrate 200 has side surfaces 200A, 200B that are slanted. Slanting angles of these side surfaces 200A, 200B can be changed as desired. In the LED of FIG. 16, however, the side surfaces are shown as slanting by 45° relative to the plane shown as the top surface in FIG. 16 for purposes of easier explanation about plane orientation. This LED of FIG. 16, using the transparent substrate 200 and slanting the first side surface 200A and the second side surface 200B of the transparent substrate 200, enables extraction of light from the light emitting layer 200 also from the side surfaces 200A, 200B, and is therefore enhanced in light extraction efficiency. Moreover, light from the light emitting layer 201 is extracted also from the third side surface (not shown) opposed to the first side surface 200A and from the fourth side surface (not shown) opposed to the second side surface 200B, and the light extraction efficiency is enhanced even more. The GaP substrate 200 is a just substrate having no gradient in plane orientation. As shown in FIG. 17, the first side surface 200 is (1-11) oriented, the second side surface 200B is (111) oriented, the third side surface is (11-1) oriented, and the fourth side surface 200D is (1-1-1) oriented.

To increase the light extraction efficiency of a semiconductor light emitting element still more, also used is a method of providing surfaces of elements with a plurality of projections and depressions that are high or deep by approximately the emission wavelength (sub-micron). This contributes to improving the light extraction efficiency by enlarging the surface area of the element and thereby improving the transmission probability of light, or making use of a change in effective refractive index. Even in the element shown in FIG. 16, light extraction efficiency can be enhanced by providing, for example, the first side surface 200A and the opposed third side surface 200C of the substrate 200 with such depressions and protrusions. In case of a GaP substrate having slanted side surfaces, it is known to be relatively easy to form depressions and protrusions on the (1-11) oriented surface and the opposed (11-1) oriented surface by wet etching. Therefore, with the element shown in FIG. 16, it is relatively easy to form such depressions and protrusions on the first side surface 200A and the opposed third side surface 200C.

If conventional InGaAlP compound semiconductor light emitting elements can be enhanced in light extraction efficiency, they must be effectively usable to various applications. Heretofore, however, it has been believed very difficult to enhance the light extraction efficiency more than that of the element of FIG. 16. This is because, in the element of FIG. 16, the second side surface 200B and the fourth side surface 200D were believed to be difficult for making depressions and protrusions.

More specifically, in case of the element of FIG. 16, the first side surface 200A of the GaP substrate 200 is (1–11) oriented, but the second side surface 200B is (111) oriented. Thus the first side surface 200A is relatively easy to process for forming depressions and protrusions by wet etching, but the second side surface 200B is difficult to process by the same method. Similarly, the third side surface 200C opposed to the first side surface 200A is (11-1) oriented and relatively easy to process for forming depressions and protrusions, but the fourth side surface 200D opposed to the second side surface is (1-1-1) oriented and difficult to process for forming depressions and protrusions. Even when the slanting angle of the side surfaces is 60°, although the first side surface 200A and the third side surface 200C are relatively easy to process for making depressions and protrusions, the second side surface 200B and the fourth side surface 200D are difficult to process.

A such, in case of forming depressions and protrusions on side surfaces of the substrate 200, since a variety of crystal orientations appear on the respective side surfaces, it is difficult to make uniform depressions and protrusions by chemical etching whose etching rate varies with the surface orientation. Therefore, no structure has been realized in which all of the side surfaces have depressions and protrusions. Accordingly, it has been the common technical knowledge that any more light extraction efficiency than that of the element of FIG. 16 is very difficult to attain.

SUMMARY OF THE INVENTION

According to embodiments of the present invention, there is provided a semiconductor light emitting element comprising:
- a light emitting layer for emitting light of a wavelength λ by current injection; and
- a GaP substrate transparent to light of the wavelength λ and having:
  - a first surface on which the light emitting layer is formed;
  - a second surface opposed to the first surface and having an area smaller than the first surface; and
  - side surfaces individually being aslant to become narrower toward the second surface and permitting part of light from the light emitting layer to be extracted externally therethrough, said side surfaces having a plurality of depressions and protrusions along outer surfaces thereof.

According to embodiments of the present invention, there is provided a method for manufacturing a semiconductor light emitting element, comprising:
- forming a light emitting layer on a first surface of a GaP substrate including the first surface and a second surface opposed to the first surface and having an area smaller than the first area, said light emitting layer emitting light of a wavelength λ permitted to pass through the GaP substrate;
- forming a plurality of side surfaces on the GaP substrate to be respectively aslant by substantially the same angle to become narrower toward the second surface; and
- forming a plurality of depressions and protrusions on the side surfaces by regrowing GaP thereon by MOCVD using source material gases of a group V source material including phosphorus and a group III source material including gallium at a growth temperature in a range from a lower limit equal to or higher than 350° C. to an upper limit equal to or lower than 706° C.

According to embodiments of the present invention, there is further provided a method for manufacturing a semiconductor light emitting element, comprising:
- forming a light emitting layer on a first surface of a GaP substrate including the first surface and a second surface opposed to the first surface and having an area smaller than the first surface, said light emitting layer emitting light of a wavelength λ permitted to pass through the GaP substrate;
- forming a plurality of side surfaces on the GaP substrate to be respectively aslant by substantially the same angle to become narrower toward the second surface; and
- forming a plurality of depressions and protrusions on the side surfaces by thermal decomposition of the side surfaces of the GaP substrate in a mixed gas of a group V source material including phosphorus with hydrogen, or hydrogen, used as the atmospheric gas, which is controlled in temperature in a range from a lower limit equal to or higher than 350° C. to an upper limit equal to or lower than 1000° C., and by removing droplets of gallium as residues of the thermal decomposition by etching with an etchant.

According to embodiments of the present invention, there is further provided a method for manufacturing a semiconductor light emitting element, comprising:
- forming a light emitting layer on a first surface of a GaP substrate including the first surface and a second surface opposed to the first surface and having an area smaller than the first surface, said light emitting layer emitting light of a wavelength λ permitted to pass through the GaP substrate;
- forming a plurality of side surfaces on the GaP substrate to be respectively aslant by substantially the same angle to become narrower toward the second surface; and
- forming a plurality of depressions and protrusions on the side surfaces by forming a metal layer of any of Al, Ti, Sn, Ag and Au by vapor deposition of sputtering and removing the metal layer by etching with an etchant.

According to embodiments of the present invention, there is further provided a method for manufacturing a semiconductor light emitting element, comprising:
- forming a light emitting layer on a first surface of a GaP substrate including the first surface and a second surface opposed to the first surface and having an area smaller than the first surface, said light emitting layer emitting light of a wavelength λ permitted to pass through the GaP substrate;
- forming a plurality of side surfaces on the GaP substrate to be respectively aslant by substantially the same angle to become narrower toward the second surface; and
- forming a plurality of depressions and protrusions on the side surfaces by blasting the side surfaces with particles containing alumina adjusted in diameter in a range from a smaller limit equal to or larger than 2 $\mu$m to a larger limit equal to or smaller than 3 $\mu$m, and etching them with an etchant.

According to embodiments of the present invention, there is further provided a method for manufacturing a semiconductor light emitting element, comprising:
- forming a light emitting layer on a first surface of a GaP substrate including the first surface and a second surface opposed to the first surface and having an area smaller than the first surface, said light emitting layer emitting light of a wavelength λ permitted to pass through the GaP substrate;
- forming a plurality of side surfaces on the GaP substrate to be respectively aslant by substantially a same angle to become narrower toward the second surface by using a dicing blade having depressions and protrusions on an outer surface thereof; and
- forming a plurality of depressions and protrusions on the side surfaces by etching them with an etchant.

According to embodiments of the present invention, there is further provided a method for manufacturing a semiconductor light emitting element, comprising:
- forming a light emitting layer on a first surface of a GaP substrate including the first surface and a second surface opposed to the first surface and having an area smaller than the first surface, said light emitting layer emitting light of a wavelength λ permitted to pass through the GaP substrate;
- forming a plurality of side surfaces on the GaP substrate to be respectively aslant by substantially a same angle to become narrower toward the second surface; and
- forming a plurality of depressions and protrusions on the side surfaces by etching with an etchant while irradiating halogen light.

According to embodiments of the present invention, there is further provided a method for manufacturing a semiconductor light emitting element, comprising:
- forming a light emitting layer on a first surface of a GaP substrate including the first surface and a second surface opposed to the first surface and having an area smaller than the first surface, said light emitting layer emitting light of a wavelength λ permitted to pass through the GaP substrate;
- forming a plurality of side surfaces on the GaP substrate to be respectively aslant by substantially a same angle to become narrower toward the second surface; and
- forming a plurality of depressions and protrusions on the side surfaces by heating them to a softening point of the GaP crystal and pressing a die defining depressions and protrusions onto the heated side surfaces.

BRIEF DESCRIPTION OF THE DRAWINGS

FIG. 2A is a schematic cross-sectional view showing a semiconductor light emitting device according to the first embodiment of the invention.

DETAILED DESCRIPTION OF THE INVENTION

Some embodiments of the invention will now be explained below with reference to the drawings. One of features of these embodiments lies in that side surfaces 10A, 10B, 10C and 10D of a transparent substrate 10 are aslant and all of these side surfaces 10A, 10B, 10C and 10D have frostlike depressions and protrusions formed by a predetermined manufacturing process. Thereby, it is possible to provide an element enhanced in light extraction efficiency and optical output. Hereunder, seven embodiments different in method of forming a plurality of depressions and protrusions will be explained.

(First Embodiment)

Figure 1:
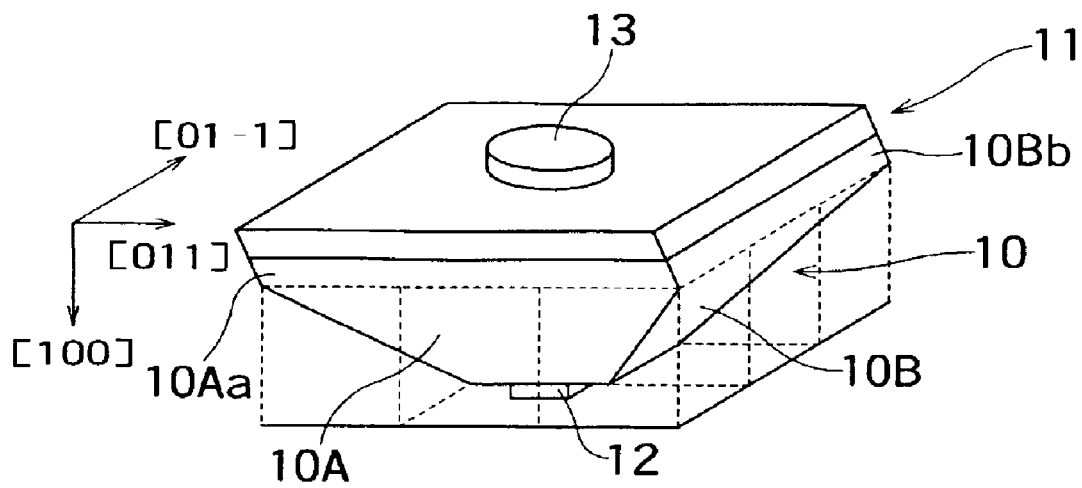
FIG. 1 is a schematic perspective view showing a semiconductor light emitting element according to the first embodiment of the invention.

FIG. 1 is a schematic perspective view showing a semiconductor light emitting element according to the first embodiment of the invention. FIG. 2(a) and 2(b) are schematic cross-sectional views of the element shown in FIG. 1, in which FIG. 2(a) is a view taken from the [01-1] direction and FIG. 2(b) is a view taken from the [011] direction.

Figure 17:
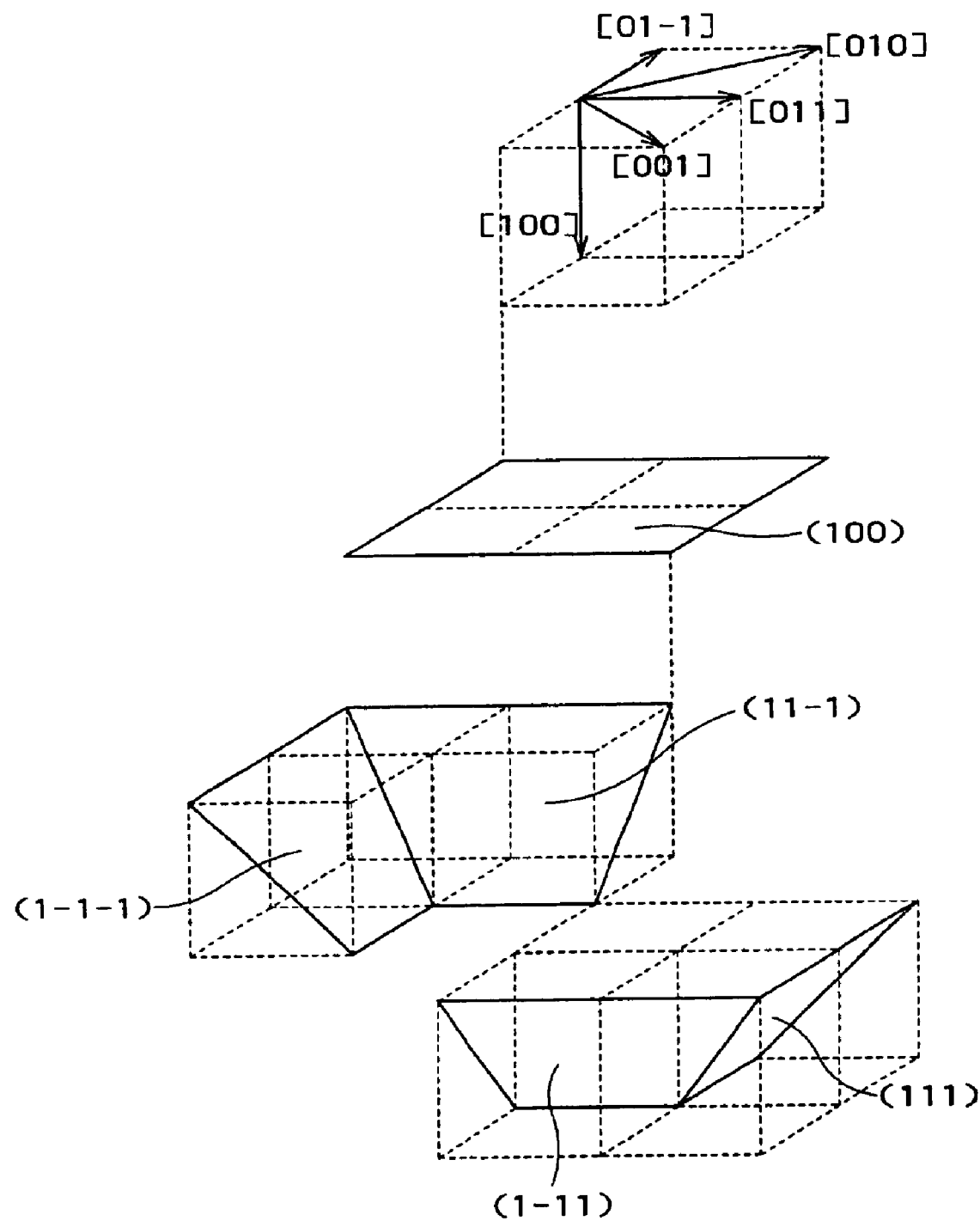
FIG. 17 is a view for explaining surface orientation of a crystal.

The semiconductor light emitting element includes a light emitting layer 11 for emitting light of the wavelength λ by current injection, and a GaP substrate 10 transparent to light of the wavelength λ. In the instant embodiment, the wavelength λ is 650 nm. The GaP substrate is an off-axis (100) GaP substrate with the off-axis angle of 15° along the [011] direction. The GaP substrate 10 has a bottom surface (first surface) 10R on which the light emitting layer 11 is formed, and a major surface (second surface) 10M opposed to the bottom surface 10R and slanted by 15° from the (100) orientation along the [011] direction. The major surface 10M has a smaller area than the bottom surface 10R. Between the major surface 10M and the bottom surface 10R, four side surfaces 10A, 10B, 10C and 10D extend to become narrower toward the major surface 10M. These four side surfaces 10A, 10B, 10C and 10D are slanted by 45° relative to the major surface 10M, and have f a plurality of depressions and protrusions of a height equal to or higher than 0.1 λ and equal to and lower than 3 λ (height in the range from 0.1 λ to 3 λ) on their outer surfaces to permit part of light from the light emitting layer 11 to be extracted through them. As shown in FIG. 17, the first side surface 10A is (1-11) oriented, the second side surface 10B is slanted by 15° from the (111) orientation, the third side surface 10C opposed to the first side surface 10A is (11-1) oriented, and the fourth side surface 10D opposed to the second side surface is slanted by 15° from the (1-1-1) orientation. Between the first to fourth side surfaces 10, 10B, 10C, 10D and the bottom surface 10R, cleaved surfaces 10Aa, 10Bb, 10Cc, 10Dd extend. Since the GaP substrate 10 is slanted by 15°, the second cleaved surface 10Bb and the fourth cleaved surface 10Dd are slanted by 15° from normal planes.

The light emitting layer 11 is supplied with a current injected from the p-side electrode 12 and the n-side electrode 13. More specifically, as shown in FIG. 2(b), the light emitting layer 11 has a structure including a p-type InGaAlP bonding layer 6, p-type InAlP clad layer 5, InGaAlP active layer 4, n-type InAlP clad layer 3 and n-type InGaAlP current diffusion layer 2 that are deposited in this order on the p-type GaP substrate 10. Additionally, the n-side electrode 13 is made by sequentially depositing an n-type GaAs contact layer 1 and an n-side electrode main body 13a. Once a current is injected from the n-side electrode 13 and the p-side electrode 12, the active layer 4 emits light of the wavelength λ. This light is extracted from the top side in the figure. The light is extracted also from the first to fourth side surfaces 10A, 10B, 10C and 10D of the GaP substrate 10.

FIG. 2A shows a semiconductor light emitting device using the semiconductor light emitting element of FIG. 1, FIG. 2(a) and FIG. 2(b). The transparent substrate 10 of the semiconductor light emitting element 1 is mounted on a lead frame 2A with Ag paste 6A used as the amount agent (adhesive). The lead frame 2A is made of a metal plated with nickel, for example, and includes a p-side lead 5, n-side lead 4 and reflection board 3. Electrically connected to the p-side lead 5 is the p-side electrode 12 by Ag paste 6. Electrically connected to the n-side lead 4 is the n-side electrode 13 by a wire 7. The semiconductor light emitting element 1 including the n-side electrode 13 and the p-side electrode 12 is sealed by sealing resin 8.

Figure 2:
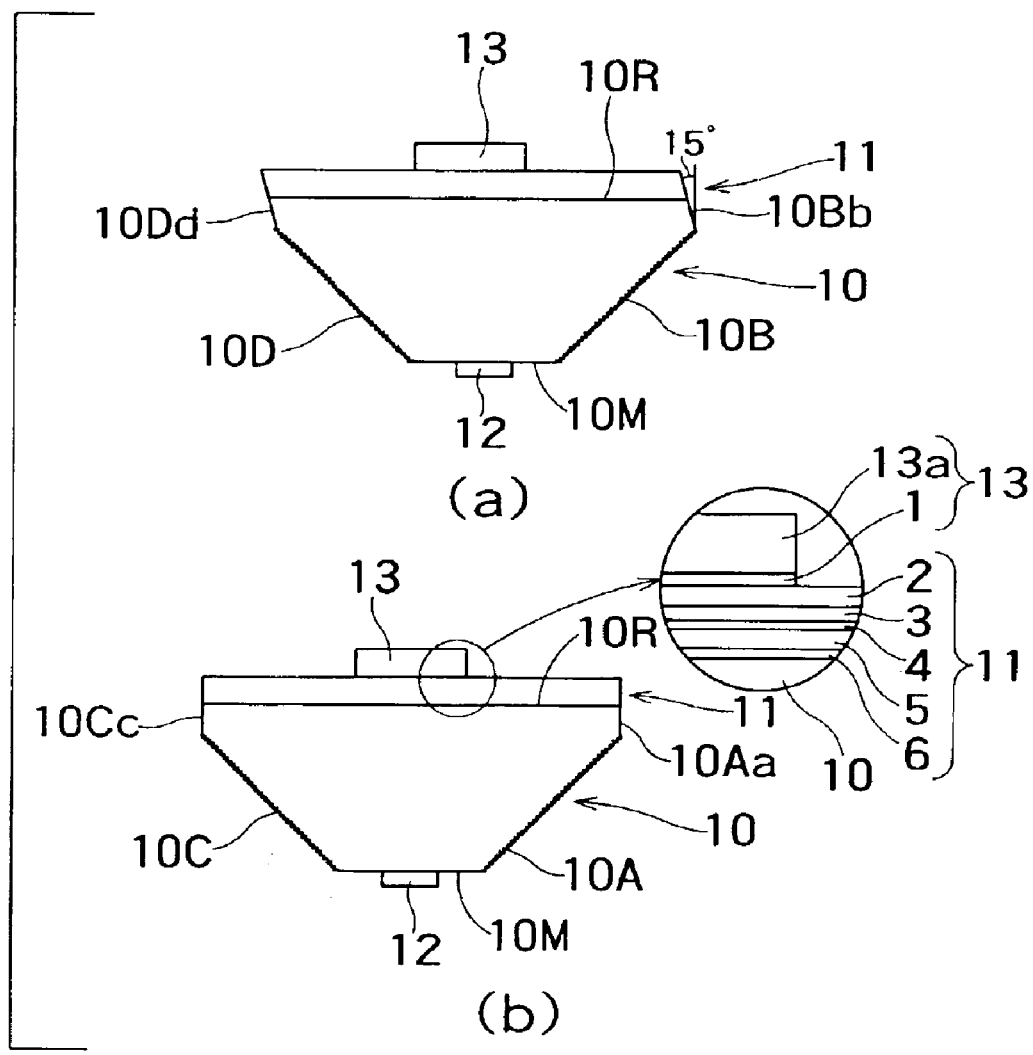
FIGS. 2(a) and 2(b) are schematic cross-sectional views showing a semiconductor light emitting element according to the first embodiment of the invention.
Figure 2A:
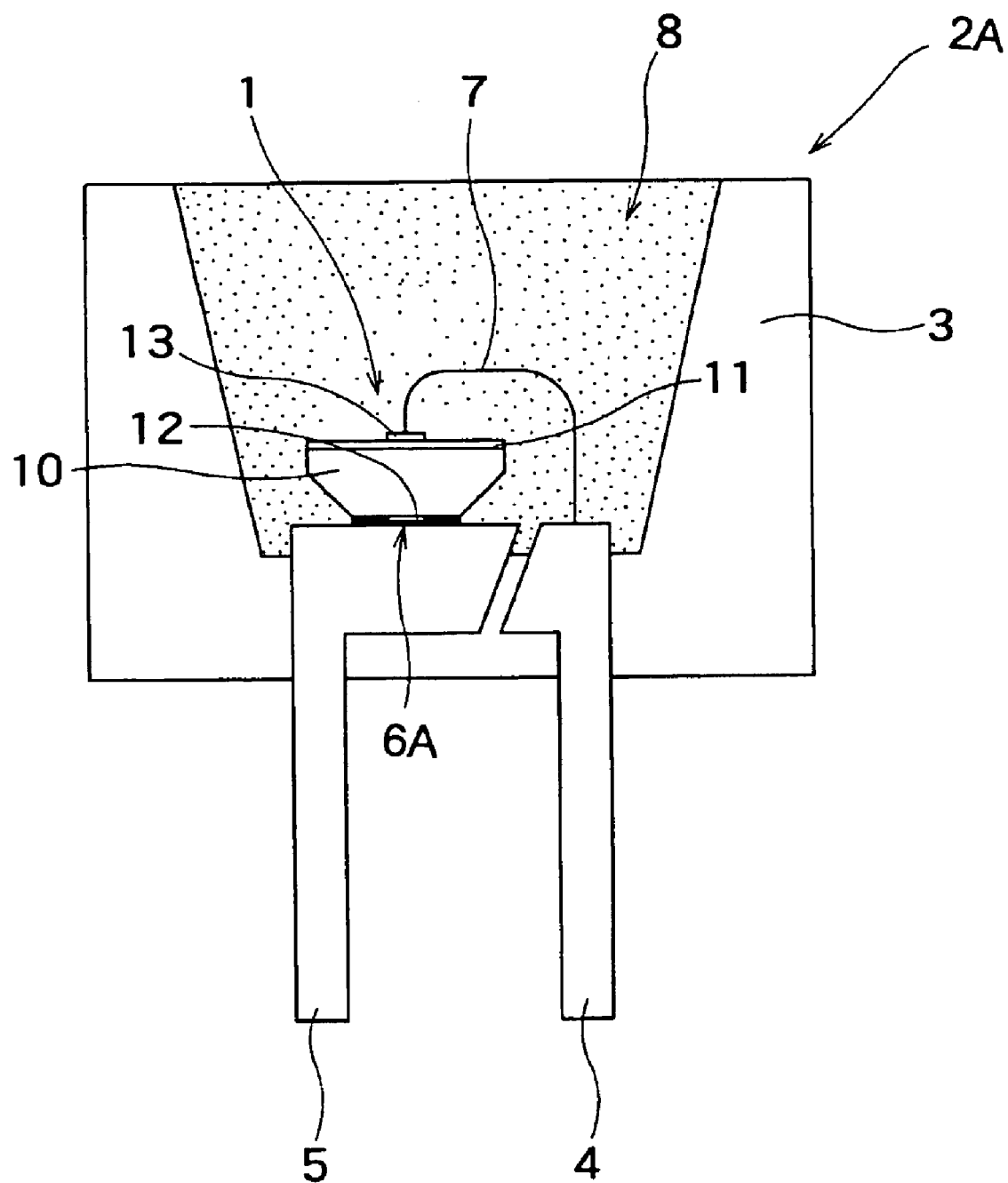

In the semiconductor light emitting element shown in FIGS. 1 and 2, the GaP substrate 10 is transparent to light from the light emitting layer 11, and the first to fourth side surfaces 10A, 10B, 10C and 10D of the GaP substrate 10 are aslant. Therefore, light extraction efficiency of the element can be enhanced by extracting light from the first to fourth side surfaces 10A, 10B, 10C and 10D.

Still in the semiconductor light emitting element shown in FIGS. 1 and 2, since the side surfaces 10A, 10B, 10C, 10D of the GaP substrate 10 have a plurality of depressions and protrusions with a height in the range from 0.1 λ to 3 λ. Therefore, the surface area of the side surfaces 10A, 10B, 10C, 10D that are used as light extraction surfaces is increased, and the light extraction efficiency is enhanced so much. As a result, the semiconductor light emitting element shown in FIGS. 1 and 2 is ensured to provide a high optical output. According to an experiment by the Inventor, such depressions and protrusions actually provided a 10% increase of the optical output, and actual improvement of the light extraction efficiency by the use of depressions and protrusions could be confirmed.

Figure 5:
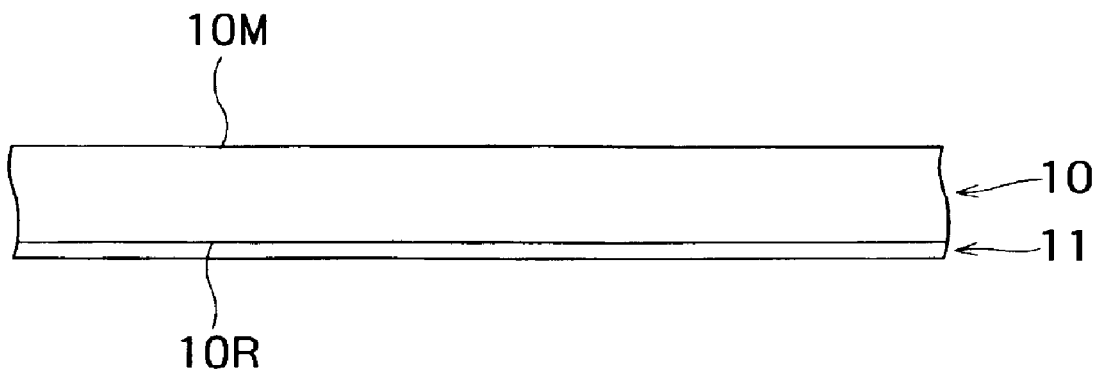
FIG. 5 is a schematic cross-sectional view showing the method of manufacturing the semiconductor light emitting element according to the first embodiment of the invention, which follows to FIG. 4.
Figure 6:
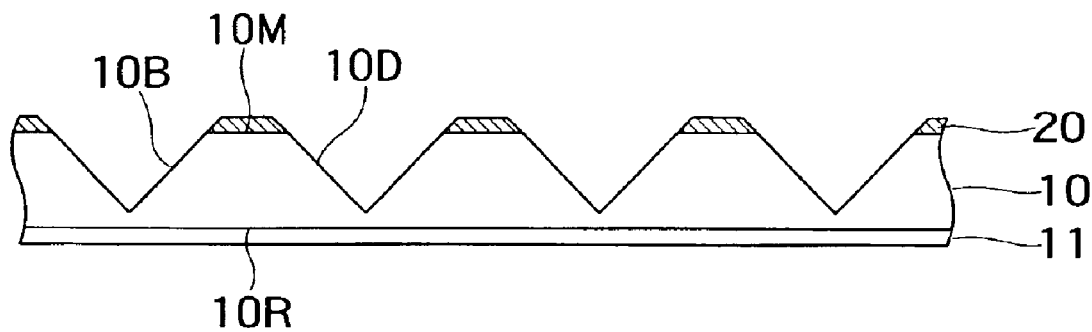
FIG. 6 is a schematic cross-sectional view showing the method of manufacturing the semiconductor light emitting element according to the first embodiment of the invention, which follows to FIG. 5.
Figure 7:
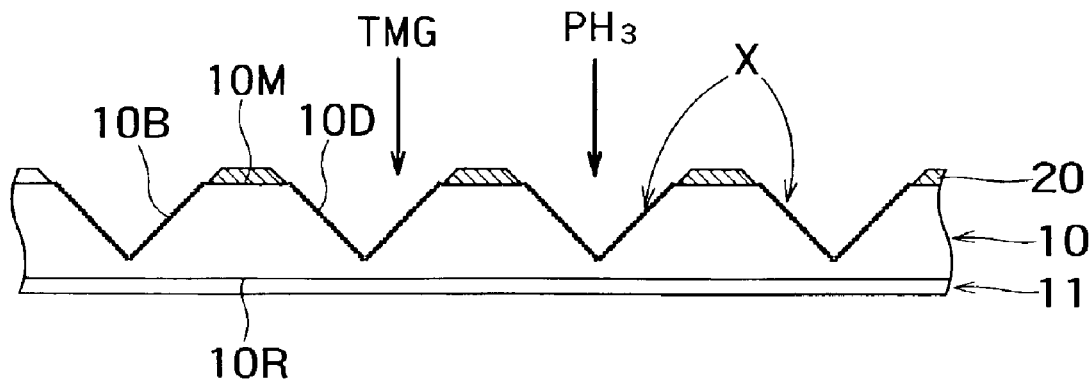
FIG. 7 is a schematic cross-sectional view showing the method of manufacturing the semiconductor light emitting element according to the first embodiment of the invention, which follows to FIG. 6.

Next explained is a method of manufacturing the semiconductor light emitting element shown in FIGS. 1 and 2 with reference to FIGS. 3 to 8. One of features of this method lies in forming the depressions and protrusions by regrowth of GaP by MOCVD as shown in FIG. 7.

Figure 3:
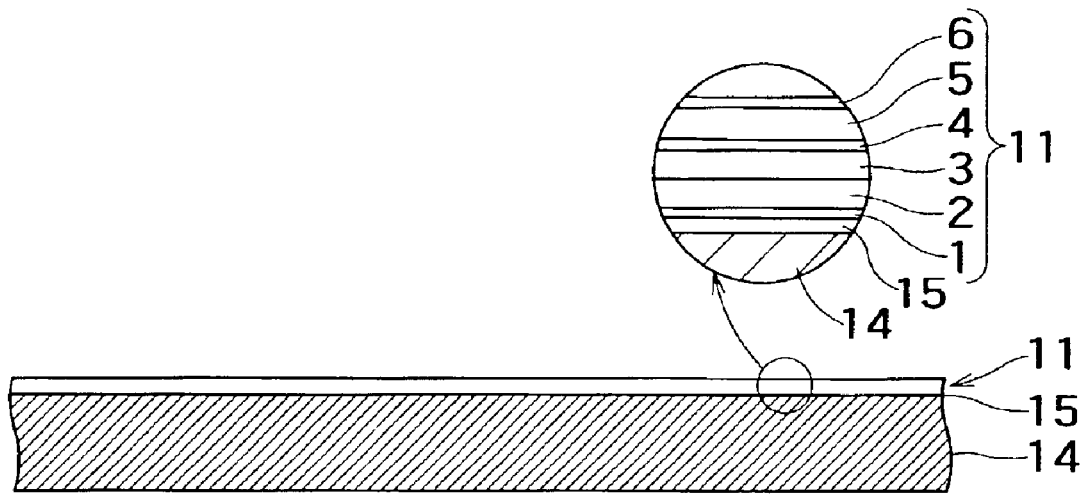
FIG. 3 is a schematic cross-sectional view showing a method of manufacturing the semiconductor light emitting element according to the first embodiment of the invention.

(1) First as shown in FIG. 3, an n-type GaAs substrate 14 having a major surface slanting by 15° from the (100) orientation along the [011] direction is cleaned with an organic solvent or sulfuric acid-based etchant, and it is introduced into a MOCVD furnace. After that, the substrate is heated to 730° C., and a source material of phosphorus (P) and an appropriate group III source material are supplied onto the major surface of the n-type GaAs substrate 14 to grow an n-type InGaP etching stop layer. Thereafter, component layers of the light emitting layer 11 from the n-type GaAs contact layer 1 to the p-type InGaAlP bonding layer 6 are grown successively. Growth thicknesses of these layers are shown below.

| | |
|---|---|
| n-type InGaP layer 15 | 0.05 (μm) |
| n-type GaAs layer 1 | 0.01 |
| n-type InGaAlP layer 2 | 3.0 |
| n-type InAlP layer 3 | 1.0 |
| undoped InGaP active layer 4 | 0.5 |
| p-type InAlP layer 5 | 1.0 |
| p-type InGaAlP layer 6 | 0.05 |

All these crystal layers are grown in lattice matching with the n-type GaAs substrate 14. Usable source materials for growth are, for example, trimethylgallium (TMG) and triethylgallium as the source material of gallium (Ga), trimethylindium and triethylindium as the source material of indium (In), trimethylaluminum and triethylaluminumas the source material of aluminum (Al), and phosphine ($PH_3$) and tertiary butyl phosphine as the source material of phosphorus (P). Monosilane and dimethylzinc were used as n-type and p-type impurities, respectively. The n-type GaAs substrate 14 is opaque to light from the active layer 4.

Figure 4:
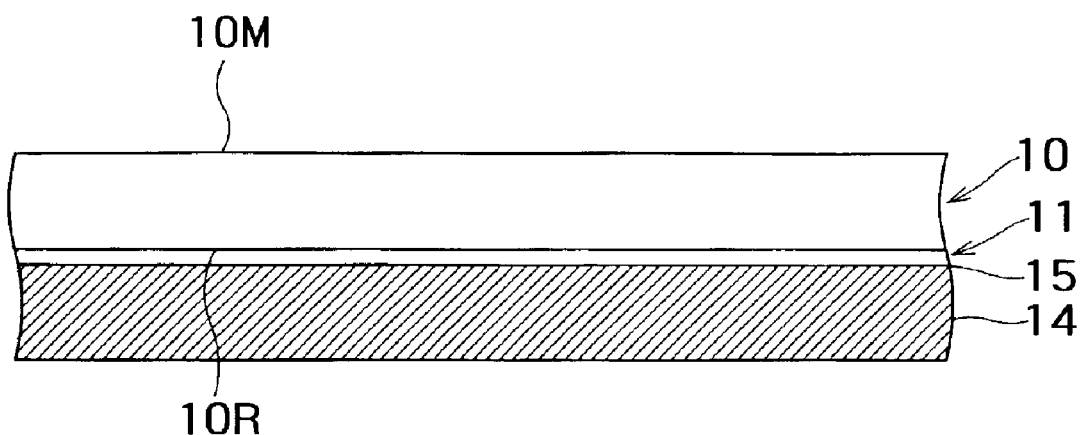
FIG. 4 is a schematic cross-sectional view showing a method of manufacturing the semiconductor light emitting element according to the first embodiment of the invention, which follows to FIG. 3.

(2) Next as shown in FIG. 4, a p-type GaP substrate 10 having a thickness from 150 μm to 250 μm is bonded onto the InGaAlP bonding layer 6 of the light emitting layer 11. The p-type GaP substrate 10 is prepared to incline its major surface 10M by 15° from the (100) orientation along the [011] direction such that it coincides in surface orientation with the major surface of the n-type GaAs substrate 14. The light emitting layer 11 is bonded to the bottom surface 10R of the p-type GaP substrate 10.

(3) Next as shown in FIG. 5, the n-type GaAs substrate 14 is removed by etching. In this process, the n-type InGaP layer 15 enables selective etching of the n-type GaAs substrate 14.

(4) Next as shown in FIG. 6, the top surface of the GaP substrate 10 is covered with a $SiO_2$ film 20, and thereafter, the GaP substrate 10 is half-diced with a blade to form the second and fourth side surfaces 10B, 10D and the first and third side surfaces 10A, 10B.

(5) Next as shown in FIG. 7, regrowth layers (depressions and protrusions) X are formed on the side surfaces 10A, 10B, 10C, 10D of the GaP substrate 10 by regrowth of GaP by MOCVD. More specifically, after the crushed layer in the half dicing portion is removed by etching using a hydrochloric acid-based etchant, the substrate is introduced into a MOCVD furnace, and GaP is regrown there. In the regrowth process of GaP, hydrogen and $PH_3$ as the group V source material are first supplied to the MOCVD furnace to make the atmosphere for the wafer. Subsequently, the wafer temperature is raised. When the temperature reaches the growth temperature 650° C., TMG as the group III source material is introduced into the furnace to start the regrowth of GaP. In the regrowth process, the V/III ratio ($PH_3$/TMG ratio) is adjusted to 150. After completion of the growth, the supply of TMG is interrupted, and the wafer temperature is lowered under the atmosphere containing hydrogen and $PH_3$.

Figure 8:
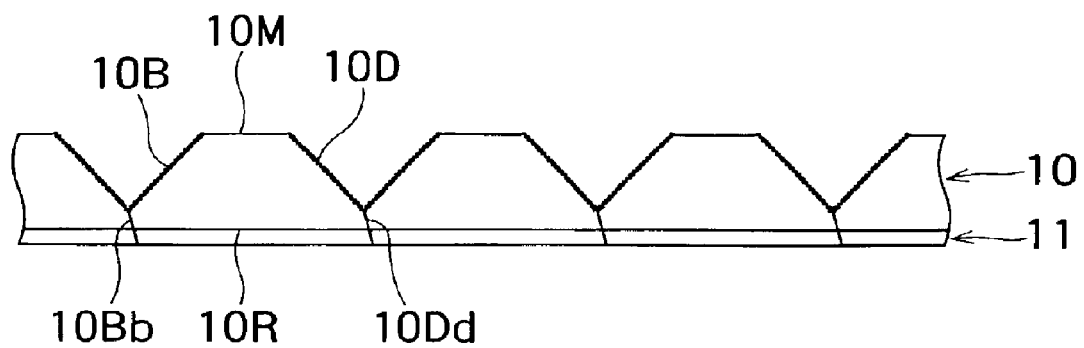
FIG. 8 is a schematic cross-sectional view showing the method of manufacturing the semiconductor light emitting element according to the first embodiment of the invention, which follows to FIG. 7.

(6) Next as shown in FIG. 8, the $SiO_2$ film 20 is removed; the wafer is cleaved to form cleaved surfaces 10Bb, 10Dd, 10Aa, 10Cd and to separate elements; the p-side and n-side electrodes 12, 13 are formed, thereby to obtain the element of FIGS. 1 and 2.

The above-explained manufacturing method according to this embodiment can make desired irregularity structures substantially uniformly on four side surfaces 10A, 10B, 10C, 10D by using regrowth of GaP by MOCVD as shown in FIG. 7. According to an experiment carried out by the Inventor, condition of the growth layer can be controlled by adjusting the growth temperature and the mod flow ratio (V/III ratio) of the source materials of the growth in the regrowth process. More specifically, by adjusting the growth temperature in the range from 350° C. to 700° C. and adjusting the V/III ratio, i.e., the $PH_3$/TMG ratio, in the range from 10 to 200, a desirable irregularity structure can be obtained. Its reason would be as follows.

For crystal growth of a GaP film by MOCVD on a GaP substrate 11, (100) orientation of the GaP substrate is preferably used to form a flat GaP film. That is, side surfaces of the element according to the instant embodiment are not suitable for forming a flat GaP film. However, the surfaces difficult to form a flat film are rather easy to form an irregular film. Additionally, the growth temperature controlled in the range from 350° C. to 700° C., slightly lower than the growth temperature of ordinary GaP, additionally make it easy to form the irregular film. These are believed to be factors contributing to formation of desired depressions and protrusions. Note that the V/III ratio is substantially the same level as that for crystal growth of ordinary GaP and special equipment need not be used for this crystal growth.

In contrast, conventional techniques mainly used wet etching for making depressions and protrusions. With this method, however, depressions and protrusions can be made on the (1-11) oriented slanting surface and the (11-1) oriented slanting surface, but it is very difficult to form depressions and protrusions on (111) oriented and (1-1-1) oriented slanting surfaces. Therefore, it is extremely difficult for this method to form depressions and protrusions even on the second side surface 10B and the fourth side surface 10D like the instant embodiment of the invention.

Moreover, in the manufacturing method according to the instant embodiment explained above, since the GaAs substrate 14 is an off substrate inclined by 15° from the (100) orientation along the [011] direction, the emission luminance of the light emitting layer 11 made of a InGaAlP compound semiconductor can be enhanced. Additionally, since the GaP substrate 10 to be bonded to the light emitting layer 11 is an off substrate inclining by 15° from the (100) orientation along the [011] direction, the light emitting layer 11 and the GaP substrate 10 coincide in crystalline orientation, and undesired increase of the operation current or operation voltage does not occur.

In the semiconductor light emitting element shown in FIGS. 1 and 2 explained above, the angle defined between the major surface M and the side surfaces 10A, 10B, 10C, 10D is 45°. However, this angle may be changed provided the side surfaces 10A, 10B, 10C, 10D make an equal angle with the major surface 10M because the side surfaces 10A, 10B, 10C and 10D are formed by dicing (FIG. 6). If they do not make an equal angle with the major surface M, then the manufacturing process will be extremely complicated. Thus the manufacturing method according to the instant embodiment makes it possible to form depressions and protrusions on any of the side surfaces 10A, 10B, 10C, 10D that are different in surface orientation.

In the semiconductor light emitting element shown in FIGS. 1 and 2, the GaP substrate 10 is an inclined substrate that inclines by 15° from the (100) orientation along the [011] direction. If this substrate is replaced by an inclined substrate that inclines by 5°~20° from the (100) orientation along the [011] direction, it is effective for enhance the emission luminance of the light emitting layer 11.

It is also possible to use a just substrate having no inclination in surface orientation as the GaP substrate 10. In this case, the second surface 10M will be (100) oriented. And the first side surface 10A will be (1-11) oriented, the second side surface 10B will be (111) oriented, the third side surface 10C will be (11-1) oriented and the fourth side surface 10D will be (1-1-1) oriented. Yet in this case, with the conventional method of forming depressions and protrusions by wet etching, although the depressions and protrusions can be made on the first side surface 10A and the third side surface 10C, it is difficult to form the depressions and protrusions on the second side surface 10B and the fourth side surface 10D. Here again, the manufacturing method according to the instant embodiment of the invention can reliably form irregularity structures on any surface with any surface orientation.

(Modification)

Figure 9:
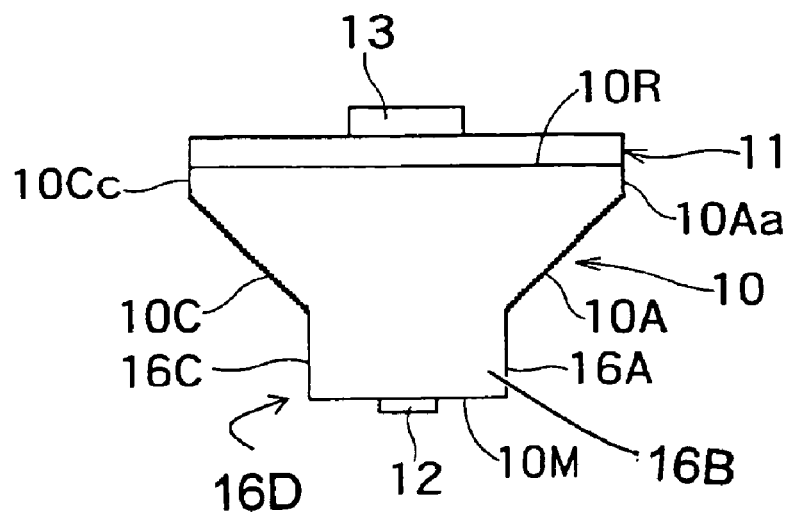
FIG. 9 is a view for explaining a semiconductor light emitting element that is a modification of the first embodiment of the invention.

FIG. 9 is a view for explaining a semiconductor light emitting element that is a modification of the first embodiment of the invention. One of features of the element shown in FIG. 9 lies in having mount-assist side surfaces 16A, 16B, 16C, 16D defined by the substrate 10. Structures of the other principal components are identical or equivalent to those f the first embodiment (FIGS. 1, 2(a) and 2(b)), and they are labeled common reference numerals.

In the element of FIG. 9, the mount-assist side surfaces 16A, 16B, 16C, 16D contribute to further enhancement of the production yield. More specifically, when the element of FIG. 9 is used, as can be understood from FIG. 2A, it is normally mounted on an p-side lead frame 5 by bonding its p-side electrode 12 and the major surface 10M with an adhesive like silver paste 6. Upon this mounting, the element of FIG. 9 has the mount-assist side surfaces 16A, 16B, 16C, 16D usable to apply silver paste for bonding in addition to the major surface 10M and the n-side electrode 12. Therefore, the element can be mounted with larger bonding force. In addition, even when the mount-assist side surfaces 16A, 16B, 16C, 16D are covered with opaque silver paste 6, light from the light emitting layer 11 can be extracted through four side surfaces 10A, 10B, 10C, 10D, and the light extraction efficiency does not degrade. Therefore, the element of FIG. 9 is advantageous for preventing separation between the n-side electrode 12 and the n-side lead frame and ensuring high production yield without degrading the light extraction efficiency.

FIG. 9 shows the example in which the mount-assist side surfaces 16A, 16B, 16C, 16D are approximately vertical surfaces. However, these surfaces may slightly incline to become wider toward the bottom surface 10R illustrated on the top in FIG. 9. In this manner, the silver paste 6 can be prevented from creeping up onto the side surfaces 10A, 10B, 10C, 10D used as the light extraction surfaces due to its surface tension before the silver paste 6 cures in a heating process.

Still in the element of FIG. 9, depressions and protrusions similar to those of the side surfaces 10A, 10B, 10C, 10D may be formed also on the mount-assist side surfaces 16A, 16B, 16C, 16D. These depressions and protrusions more effectively prevent the silver paste 6 from creeping up. Depressions and protrusions on the mount-assist side surfaces 16A, 16B, 16C, 16D can be made by substantially the same method as that for making the depressions and protrusions on the side surfaces 10A, 10B, 10C, 10D. In case the mount-assist side surfaces 16A, 16B, 16C, 16D are substantially vertical, depressions and protrusions can be made substantially uniformly on four mount-assist side surfaces 16A, 16B, 16C, 16D even by wet etching.

(Second Embodiment)

Figure 10:
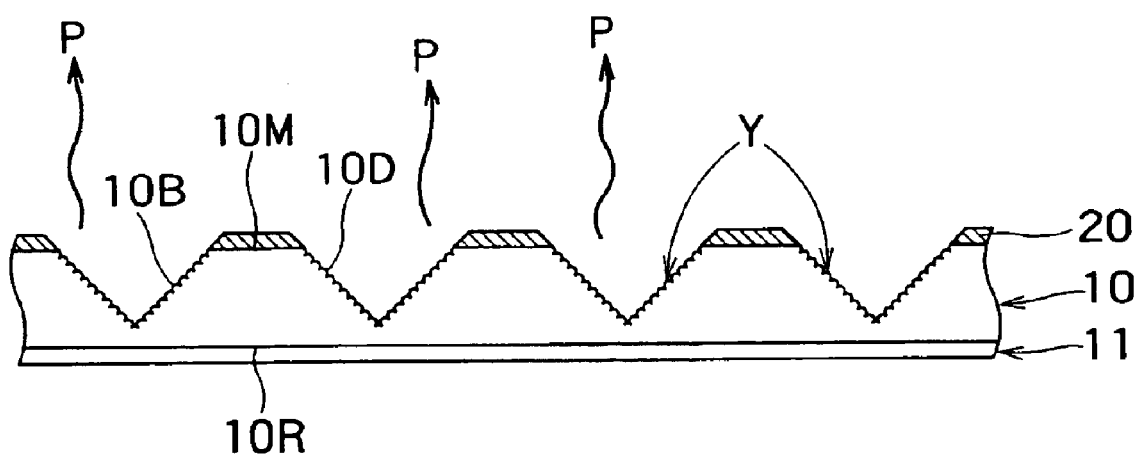
FIG. 10 is a view for explaining a method of manufacturing a semiconductor light emitting element according to the second embodiment of the invention.

As shown in FIG. 10, the second embodiment makes depressions and protrusions by thermal decomposition of the GaP crystal 11 in a MOCVD furnace. The element has the same configuration as the element shown in FIGS. 1, 2(a) and 2(b). The manufacturing method shown here is identical to the first embodiment except for the process of making depressions and protrusions (FIGS. 3 through 6 and FIG. 8). Explained hereunder the process of making the depressions and protrusions with reference to FIG. 10.

First of all, similarly to the first embodiment, after the crushed layer in the half dicing portion of the wafer is removed by hydrochloric acid-based etching while it is covered with the $SiO_2$ film 20, the wafer is introduced into a MOCVD furnace. After that, hydrogen and $PH_3$ are introduced into the furnace, and the wafer temperature is raised to thermally decompose part of the GaP substrate 10 not covered by the $SiO_2$ film 20. Under the condition, thermal decomposition begins when the substrate temperature reached approximately 350 degrees. As a result, P having a relatively high vapor pressure is released externally of the crystal, and the remainder Ga binds to adjacent Ga to form droplets Y and remains on the surface. Size and density of the Ga droplets can be controlled by adjusting the substrate temperature and the temperature raising rate.

Quantity and rate of releasing P can be adjusted by mixing $PH_3$ in the atmospheric gas and controlling the ratio of its mixture. For example, in case an excessive quantity of P is released when the atmospheric gas is composed exclusively of hydrogen, the released quantity of P can be reduced by mixing $PH_3$ to hydrogen in the atmospheric gas. This method of control enables appropriate control of Ga droplets Y. Annealing was actually carried out under the wafer temperature of 700° C. for five minutes in an atmospheric gas containing 5% $PH_3$ mixed in hydrogen. As a result, Ga droplets Y as high as ~0.5 μm could be formed by the density of $1\times10^8$ pieces/cm² on the surfaces.

After that, the wafer was removed from the MOCVD furnace, and underwent etching using a hydrochloric acid-based etchant. As a result, due to a difference in etching rate between locations with Ga droplets Y and locations without Ga droplets, irregularity structures having a height in the range from 0.1 λ to 3 λ could be formed on the side surfaces 10A, 10B, 10C, 10D of the GaP substrate 10. Since Ga droplets Y absorb light, they should be removed as far as possible during the etching.

It has been believed heretofore that thermal decomposition explained above deteriorates the property of the element and must be prevented to the utmost. The Inventor, however, personally gets aware of the fact that high-property elements can be obtained by making positive use of thermal decomposition of GaP and thereby forming depressions and protrusions against the conventional technical knowledge. In an experiment carried out by the Inventor, desirable depressions and protrusions could be formed by inviting thermal decomposition in a mixed gas of a group V source material containing P and hydrogen, or in hydrogen, used as the atmospheric gas at temperatures controlled in the range from the lower limit of 350° C. to the upper limit of 1000° C.

(Third Embodiment)

As the third embodiment, a method of forming a metal film by deposition or vapor deposition and thereafter forming depressions and protrusions by etching the metal film is explained hereunder.

Figure 11:
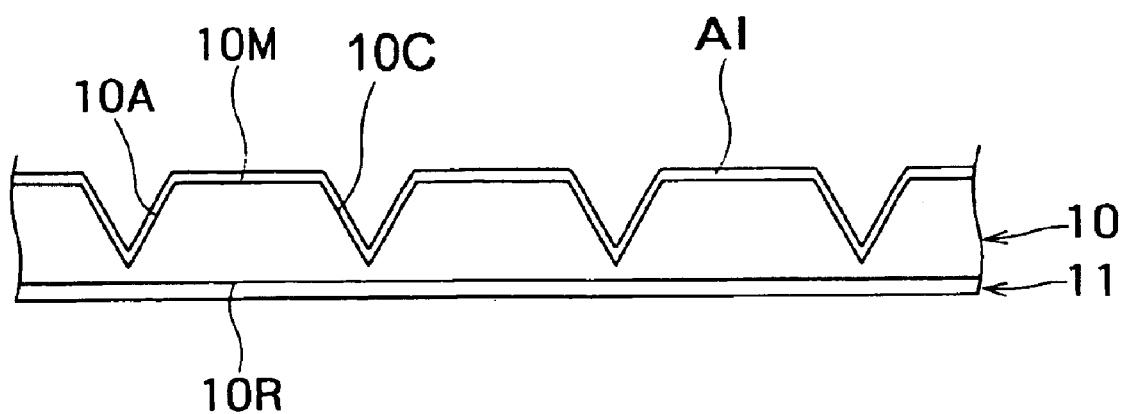
FIG. 11 is a view for explaining a method of manufacturing a semiconductor light emitting element according to the third embodiment of the invention.

As shown in FIG. 11, half dicing is carried out on the GaP crystal surface with a blade having the knife angle of 60° to form V grooves. Subsequently, Al is deposited up to a thickness around 50 nm on the entire surface including the V grooves by vapor deposition or sputtering. After that, the wafer is immersed into a solution containing hydrochloric acid as its major component. Then the reaction of the GaP surface is promoted when the Al metal is etched, and random surface etching occurs. The reaction can be promoted more by first annealing the substrate with Al by vapor deposition at ~200° or more and thereafter immersing it into a solution containing hydrochloric acid as its major component. As a result, irregularity structures are formed on the GaP crystal surface. Although the instant embodiment uses Al as the metal for vapor deposition, Ti, Sn, Ag, Au and other metals are also usable.

In the element of FIG. 11, the side surfaces 10A, 10B, 10C, 10D each make the angle of 60° with the bottom surface 10R. Therefore, the first side surface 10A is slanted from the (111) orientation; the second side surface is (111) oriented; the third side surface 10C is slanted by 150 from the (11-1) orientation; and the fourth side surface 10D is slanted by 30° from the (1-1-1) orientation. Because the side surfaces are all different in surface orientation, it was extremely difficult to evenly form depressions and protrusions on all these side surfaces with the conventional method relying on wet etching. The instant embodiment, however, configured to first deposit of stack the metal layer and thereafter etch the metal layer, can form depressions and protrusions on any of the side surfaces.

(Fourth Embodiment)

As the fourth embodiment of the invention, a method of forming irregularity structures by sand blasting will be explained below.

Figure 12:
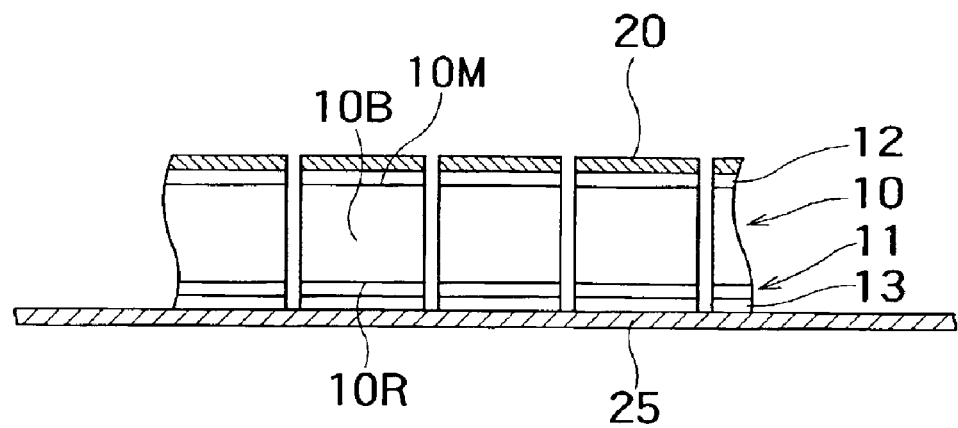
FIG. 12 is a view for explaining a method of manufacturing a semiconductor light emitting element according to the fourth embodiment of the invention.

FIG. 12 is an explanatory view of processing by sand blasting. Explanation will be made here, taking the case of forming depressions and protrusions on the second side surface 10B as an example. In FIG. 12, after the ohmic electrodes 12, 13 are formed on the major surface 10M and the bottom surface 10R of the GaP substrate 10, a protective resist 20 is formed on the top surface of the p-side electrode 12. Thereafter, the n-side electrode 13 is bonded to an adhesive sheet 25, and the wafer is separated into discrete chips by dicing. In this condition, sandblasting is carried out on the side surface 10B of each chip. When alumina is used as particles to be blasted while adjusting the grain size of the particles to 2~3 μm and keeping the air pressure of 3 kgf/cm², depressions and protrusions as large as several μm are formed on the chip side surface 10B. In this case, a certain percentage of the surface nearest to the (111)P surface is exposed. After that, when the chip side surface is immersed into hydrochloric acid heated to 60° C., the (111)P surface is etched into the form of micro-irregular surface with dense needlelike projections of a submicron size.

As already explained, the use of alumina of a grain size of 2~3 μm as the particles to be blasted provides a favorable result presumably because the hardness, weight, specific gravity and other factors of alumina are suitable for forming depressions and protrusions on the GaP substrate 10.

(Fifth Embodiment)

As the fifth embodiment of the invention, a method of forming irregularity structures by means of a special blade will be explained below.

Figure 13:
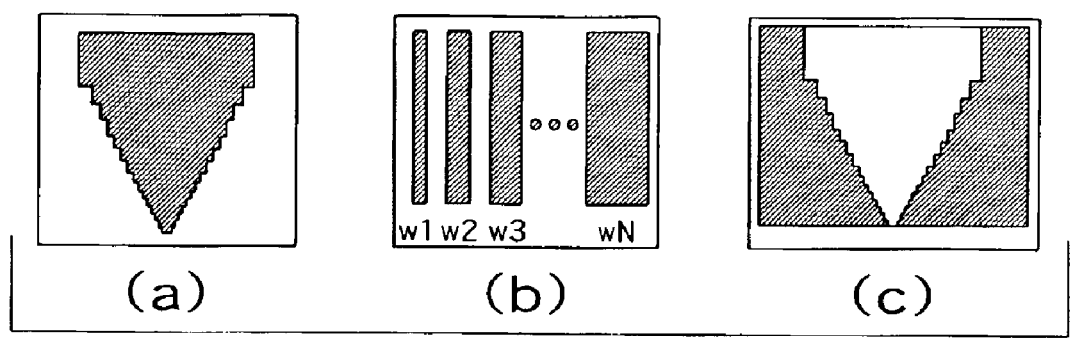
FIGS. 13(a) through 13(c) are views for explaining a method of manufacturing a semiconductor light emitting element according to the fifth embodiment of the invention.

When the half dicing shown in FIG.6 is carried out, with a cross section as shown in FIG. 13(c) is formed in the GaP substrate with a blade have a cross-section configuration as shown in FIG. 13(a). Alternatively, a desired number of different thickness blades w1–wN are prepared as shown in FIG. 13(b), and cutting is carried out by sequentially using these blade from the narrowest one to from a cross section of crystal as shown in FIG. 13(c), By repeating such cutting of the crystal, innumerable surfaces difference in orientation are formed along the cut crystal surface. The by etching the cut surface by means of an etching action upon, for example, the (111) oriented planes exclusively, a surface by frost processing is obtained.

(Sixth Embodiment)

As the sixth embodiment of the invention, a method of forming irregularity structures by light-irradiated etching will be explained below.

Figure 14:
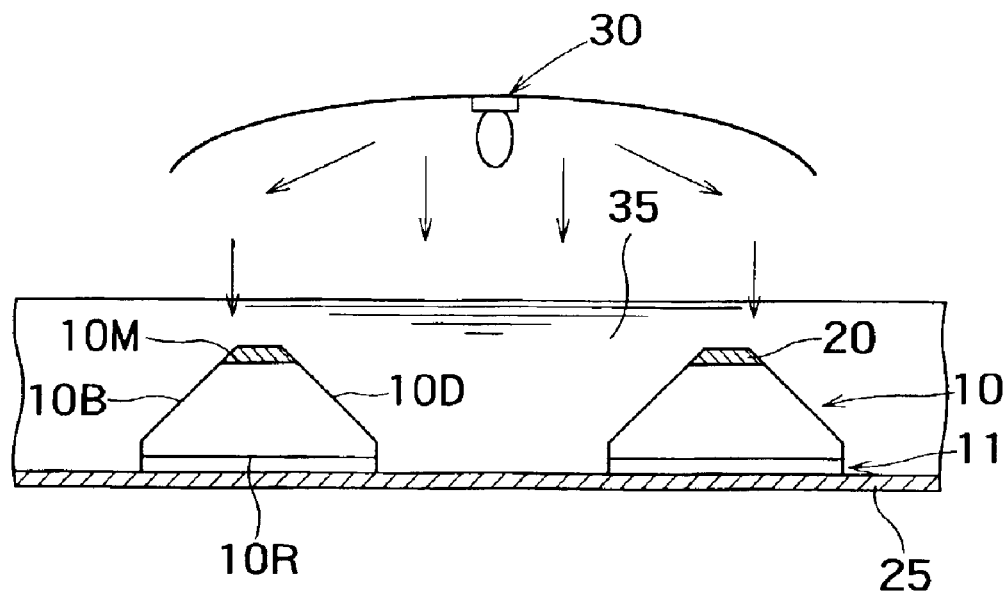
FIG. 14 is a view for explaining a method of manufacturing a semiconductor light emitting element according to the sixth embodiment of the invention.

FIG. 14 shows an image diagram of the processing by light-irradiated etching. The light emitting layer 11 of a LED chip is flexed to an adhesive sheet 25, and the major surface of the Gap substrate 10 is protected with the protective resist 20. When the side surface 10a, 10B, 10C, 10D of the LED chip are etching by etching 35, intensive light such as halogen light 30 is irradiated to etch them. As a result, side surfaces 10A, 10B, 10C, 10D processed by frosting can be obtained.

(Seventh Embodiment)

As the seventh embodiment of the invention, a method of forming irregularity structures by a press process will be explained below.

Figure 15:
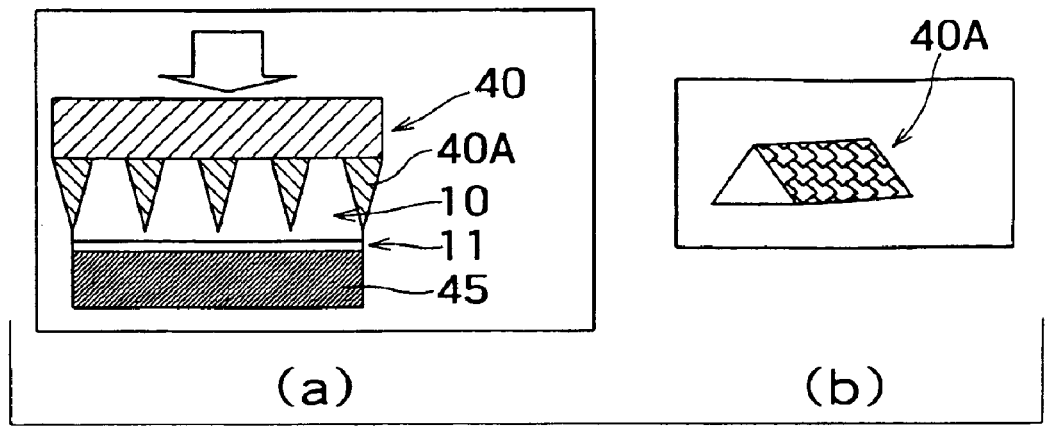
FIGS. 15(a) and 15(b) are views for explaining a method of manufacturing a semiconductor light emitting element according to the seventh embodiment of the invention.
Figure 16:
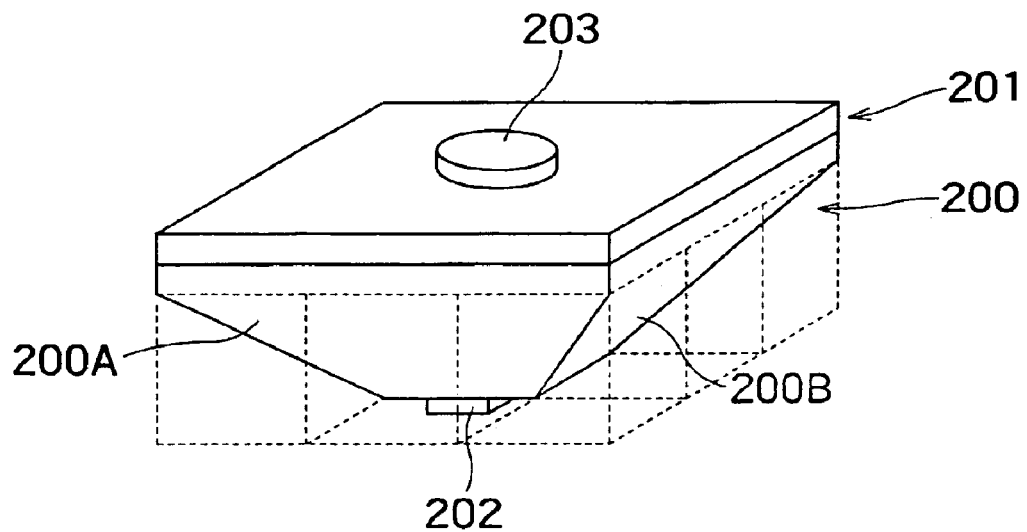
FIG. 16 is a schematic cross-sectional view of a conventional semiconductor light emitting element.

A metal die 40 including a die 40A as shown in FIG. 15(b) (processed by frosting to its surface for contact with crystal)

is prepared beforehand, and the side surfaces 10A, 10B, 10C, 10D of the wafer processed by dicing are depressed as shown in FIG. 15(a) to transfer the frostlike depressions and protrusions onto the crystal. Thus a frost-processed surface is obtained. Before the press process, the seat 45, wafer 10 and metal die 40 are heated beforehand to the softening point of the crystal.

Additional advantages and modifications will readily occur to those skilled in the art. Therefore, the invention in its broader aspects is not limited to the specific details and representative embodiments shown and described herein. Accordingly, various modifications may be made without departing from the spirit or scope of general inventive concept as defined by the appended claims and their equivalents.

What is claimed is:

1. A semiconductor light emitting element comprising:
    a light emitting layer for emitting light of a wavelength $\lambda$ by current injection; and
    a GaP substrate transparent to light of the wavelength $\lambda$, the GaP substrate being an off-axis (100) GaP substrate with an off-axis angle of $\theta$ ($5° \leq \theta \leq 20°$) along the direction, and having:
    a first surface on which the light emitting layer is formed;
    a second surface opposed to the first surface and having an area smaller than the first surface; and
    first to fourth side surfaces, the first and the third side surfaces being opposed to each other, the second and the fourth side surfaces being opposed to each other, the first side surface being (1-11) oriented, the second side surface being slanted from a (111) orientation, the third side surface being (11-1) oriented, the fourth side surface being slanted from a (1-1-1) orientation, the first to fourth side surfaces individually being aslant to become narrower toward the second surface and permitting part of light from the light emitting layer to be extracted externally therethrough, the first to fourth side surfaces having a plurality of depressions and protrusions along outer surfaces thereof,
    wherein the depressions and protrusions have a height in a range from a lower limit equal to or higher than 0.1 $\lambda$ to an upper limit equal to or lower than 3 $\lambda$.

2. A semiconductor light emitting element according to claim 1 wherein the first to fourth side surfaces are respectively aslant by substantially a same angle to become narrower toward the second surface.

3. A semiconductor light emitting element according to claim 1 wherein the light emitting layer includes an InGaAlP layer.

4. A semiconductor light emitting element according to claim 1 wherein the wavelength $\lambda$ is 650 nm.

5. A semiconductor light emitting element comprising:
    a light emitting layer for emitting light of a wavelength $\lambda$ by current injection; and
    a GaP substrate transparent to light of wavelength $\lambda$, the GaP substrate is a just substrate having no inclination in surface orientation and having:
    a first surface on which the light emitting layer is formed;
    a second surface opposed to the first surface and having an area smaller than the first surface; and
    first to fourth side surfaces, the first and the third side surfaces being opposed to each other, the second and the fourth side surfaces being opposed to each other, the first side surface being (1-11) oriented, the second side surface being (111) orientated, the third side surface being (11-1) oriented, the fourth side surface being (1-1-1) orientated, said first to fourth side surfaces individually being aslant to become narrower toward the second surface and permitting part of light from the light emitting layer to be extracted externally therethrough, the first to fourth side surfaces having a plurality of depressions and protrusions along outer surfaces thereof for enhancing light extraction efficiency and optical output,
    wherein the depressions and protrusions have a height in a range from a lower limit equal to or higher than 0.1 $\lambda$ to an upper limit equal to or lower than 3 $\lambda$.

6. A semiconductor light emitting element according to claim 5 wherein the side surfaces are respectively aslant by substantially a same angle to become narrower toward the second surface.

7. A semiconductor light emitting element according to claim 5 wherein the light emitting layer includes an InGaAlP layer.

8. A semiconductor light emitting element according to claim 5 wherein the wavelength $\lambda$ is 650 nm.

* * * * *